US009460990B1

(12) United States Patent
Sung

(10) Patent No.: US 9,460,990 B1
(45) Date of Patent: Oct. 4, 2016

(54) SUBSTRATES AND SEMICONDUCTOR PACKAGES INCLUDING THE SAME, ELECTRONIC SYSTEMS INCLUDING THE SEMICONDUCTOR PACKAGES, AND MEMORY CARDS INCLUDING THE SEMICONDUCTOR PACKAGES

(71) Applicant: SK hynix Inc., Icheon-si Gyeonggi-do (KR)

(72) Inventor: Ki Jun Sung, Cheongju-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/830,955

(22) Filed: Aug. 20, 2015

(30) Foreign Application Priority Data

Apr. 13, 2015 (KR) .................. 10-2015-0052035

(51) Int. Cl.
*H01L 23/498* (2006.01)
*H01L 23/31* (2006.01)
*H05K 1/03* (2006.01)
*H05K 1/09* (2006.01)

(52) U.S. Cl.
CPC ..... *H01L 23/49816* (2013.01); *H01L 23/3107* (2013.01); *H01L 23/49827* (2013.01); *H05K 1/0326* (2013.01); *H05K 1/0346* (2013.01); *H05K 1/09* (2013.01); *H05K 2201/0154* (2013.01); *H05K 2201/068* (2013.01)

(58) Field of Classification Search
CPC .......... H01L 23/3107; H01L 23/49816; H01L 23/49827; H05K 1/10326; H05K 1/0346; H05K 1/09
See application file for complete search history.

(56) References Cited

U.S. PATENT DOCUMENTS

| | | | |
|---|---|---|---|
| 2002/0180015 A1* | 12/2002 | Yamaguchi | H01L 21/486 257/678 |
| 2006/0076671 A1 | 4/2006 | Kariya et al. | |
| 2008/0150159 A1* | 6/2008 | Aberin | H01L 21/563 257/778 |
| 2010/0108361 A1* | 5/2010 | Sakaguchi | H01L 21/486 174/251 |
| 2011/0012266 A1* | 1/2011 | Horiuchi | H01L 21/561 257/773 |
| 2011/0210444 A1* | 9/2011 | Jeng | H01L 23/13 257/738 |
| 2012/0299177 A1* | 11/2012 | Chao | H01L 23/481 257/737 |
| 2013/0093097 A1* | 4/2013 | Yu | H01L 21/568 257/774 |
| 2013/0168856 A1* | 7/2013 | Wang | H01L 25/105 257/738 |
| 2014/0138822 A1* | 5/2014 | Williamson | H01L 23/49827 257/738 |
| 2015/0115467 A1* | 4/2015 | Park | H05K 1/141 257/774 |
| 2015/0235915 A1* | 8/2015 | Liang | H01L 23/145 361/764 |
| 2015/0235991 A1* | 8/2015 | Gu | H01L 25/0655 257/762 |

FOREIGN PATENT DOCUMENTS

KR 1020140038519 A 3/2014

* cited by examiner

*Primary Examiner* — Allan R Wilson
(74) *Attorney, Agent, or Firm* — William Park & Associates Ltd.

(57) ABSTRACT

A substrate may include a body having a first surface and a second surface opposite to each other, at least one first wiring pattern disposed on the first surface of the body to include a bonding finger, an upper insulating pattern disposed on the first surface of the body to cover the overall surface of the at least one first wiring pattern except the bonding finger, and a second wiring pattern disposed on the second surface of the body. The substrate may include a lower insulating pattern disposed on the second surface of the body to cover the second wiring pattern, and a first via electrode penetrating the body from the first surface to the second surface and coupling the at least one first wiring pattern to the second wiring pattern. The body may include a first film and the upper and lower insulating patterns may include second films.

23 Claims, 23 Drawing Sheets

FIG.19
(a) 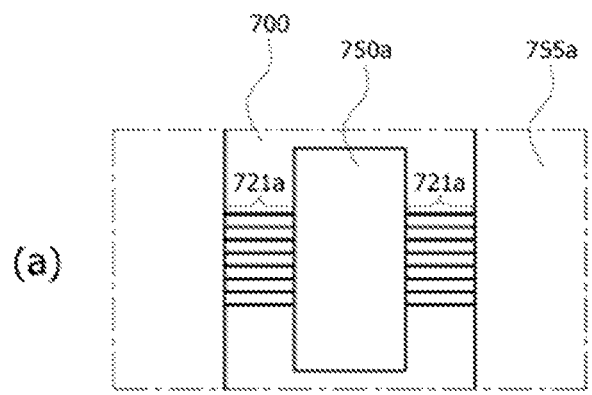
(b) 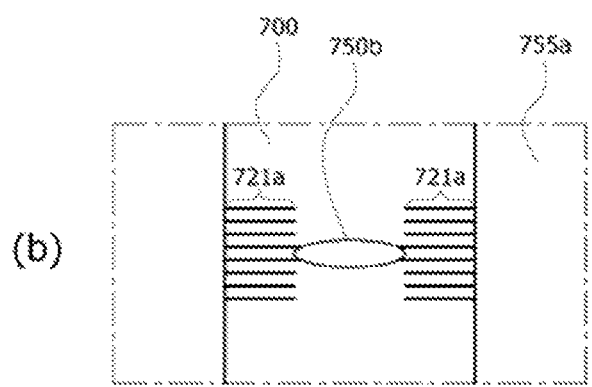

SUBSTRATES AND SEMICONDUCTOR
PACKAGES INCLUDING THE SAME,
ELECTRONIC SYSTEMS INCLUDING THE
SEMICONDUCTOR PACKAGES, AND
MEMORY CARDS INCLUDING THE
SEMICONDUCTOR PACKAGES

CROSS-REFERENCE TO RELATED
APPLICATION

The present application claims priority under 35 U.S.C 119(a) to Korean Application No. 10-2015-0052035, filed on Apr. 13, 2015, in the Korean intellectual property Office, which is incorporated herein by reference in its entirety.

BACKGROUND

1. Technical Field

Various embodiments of the present disclosure generally relate to packaging technology and, more particularly, to substrates, semiconductor packages including the same, electronic systems including the semiconductor package, and memory cards including the semiconductor package.

2. Related Art

Electronic devices required for electronic systems comprise various active and passive circuit elements. These circuit elements integrated on a semiconductor substrate are referred to as a semiconductor chip or die. The electronic devices can be provided as a semiconductor package including the semiconductor chip or die mounted on a package substrate such as PCB (printed circuit board) having circuit wires. Notably, as the size and thickness of the electronic products such as computers and smart phones are continuously reduced, the semiconductor packages employed in the electronic products have been scaled down. However, if the semiconductor packages are scaled down, the semiconductor packages may be more susceptible to being warped. The warpage phenomenon of the semiconductor package may degrade the reliability of the electronic products. Accordingly, it is required to control the warpage phenomenon of the semiconductor package with realization of thin semiconductor package.

SUMMARY

According to an embodiment, a substrate may be provided. The substrate may include a body having a first surface and a second surface opposite to each other, and at least one first wiring pattern disposed on the first surface of the body to include a bonding finger. The substrate may include an upper insulating pattern disposed on the first surface of the body to cover the overall surface of the at least one first wiring pattern except the bonding finger. The substrate may include a second wiring pattern disposed on the second surface of the body, and a lower insulating pattern disposed on the second surface of the body to cover the second wiring pattern. The substrate may include a first via electrode penetrating the body from the first surface to the second surface and coupling the at least one first wiring pattern to the second wiring pattern. The body may include a first film (i.e., but not limited to, a first film comprising polyimide (PI)) film. The upper and lower insulating patterns may include second films (i.e., but not limited to, a second film including prepreg (PPG)).

In various embodiments, the coefficient of thermal expansion of the first film may be different from the coefficient of thermal expansion of the second films.

In various embodiments, the first film may include a polyimide (PI) film and the second films include prepreg (PPG).

In various embodiments, the at least one first wiring pattern and the bonding finger may include copper (Cu).

In various embodiments, the at least one first wiring pattern may include a couple of first wiring patterns, wherein one of the couple of first wiring patterns has a first bonding finger and the other of the couple of first wiring patterns has a second bonding finger, and wherein the first and second bonding fingers are disposed to be spaced apart from each other by a predetermined distance in a horizontal direction.

In various embodiments, the substrate may further include a second via electrode penetrating the upper insulating pattern to contact the first wiring pattern, a first conductive layer pattern disposed on the upper insulating pattern to contact the second via electrode, a third via electrode penetrating the lower insulating pattern to contact the second wiring pattern, and a ball land pad disposed on a surface of the lower insulating pattern opposite to the body to contact the third via electrode.

In various embodiments, the first conductive layer pattern may act as a power or ground (PWR/GND) line.

In various embodiments, the upper insulating pattern and the lower insulating pattern may have substantially the same thickness.

According to an embodiment, a semiconductor package may be provided. The semiconductor package may include a body having a first surface and a second surface opposite to each other, and at least one first wiring pattern disposed on the first surface of the body to include a bonding finger. The semiconductor package may include an upper insulating pattern disposed on the first surface of the body to cover the overall surface of the at least one first wiring pattern and to exposeexcept the bonding finger, wherein the upper insulating pattern includes a second film. The exposed portion of the at least one first wiring pattern may act as a bonding finger. A lower insulating pattern may be disposed on the second surface of the body. A semiconductor chip may be disposed over the first surface of the body. A metal post may be disposed between the semiconductor chip and the bonding finger. A molding member may be disposed to cover the semiconductor chip. The body may include a first film. The upper and lower insulating patterns may include second films.

In various embodiments, the coefficient of thermal expansion of the first film may be different from the coefficient of thermal expansion of the second films.

In various embodiments, the first film may include a polyimide (PI) film and the second films include prepreg (PPG).

In various embodiments, the semiconductor package further include a second wiring pattern disposed on the second surface of the body and covered with the lower insulating pattern, a first via electrode penetrating the body from the first surface to the second surface and coupling the at least one first wiring pattern to the second wiring pattern, a second via electrode disposed in the upper insulating pattern to contact the at least one first wiring pattern, a first conductive layer pattern disposed on the upper insulating pattern to contact an end of the second via electrode, a third via electrode disposed in the lower insulating pattern to contact the second wiring pattern, and a ball land pad disposed on a surface of the lower insulating pattern opposite to the body to contact the third via electrode.

In various embodiments, the at least one first wiring pattern may include a couple of first wiring patterns, wherein one of the couple of first wiring patterns has a first bonding finger and the other of the couple of first wiring patterns has a second bonding finger, and wherein the first and second bonding fingers are disposed to be spaced apart from each other by a predetermined distance in a horizontal direction.

In various embodiments, the metal post may be disposed in a vertical pillar shape, and wherein one end of the metal post is bonded to the semiconductor chip, and the other is bonded to the bonding finger.

In various embodiments, the first conductive layer pattern may include a power or ground (PWR/GND) line.

In various embodiments, the upper insulating pattern and the lower insulating pattern may have substantially the same thickness.

According to an embodiment, a semiconductor package may be provided. The semiconductor package may include a body having a first surface and a second surface opposite to each other, at least one first wiring pattern disposed on the first surface of the body to include a bonding finger, and an upper insulating pattern disposed on the first surface of the body to cover the overall surface of the at least one first wiring pattern and to exposeexcept the bonding finger, wherein the upper insulating pattern includes a second film. At least one second wiring pattern may be disposed on the second surface of the body. A lower insulating pattern may be disposed on the second surface of the body to cover one portion of the at least one second wiring pattern and to expose the other portion of the at least one second wiring pattern. The exposed portion of the at least one second wiring pattern may act as a second bonding finger. A first semiconductor chip may be disposed on the first surface of the body. A first metal post may couple the first semiconductor chip to the first bonding finger. A second semiconductor chip may be disposed on the second surface of the body. A second metal post may electrically couple the second semiconductor chip to the second bonding finger. A molding member may be disposed to cover one of the first and second semiconductor chips. The body may include a first film. The upper and lower insulating patterns may include second films.

In various embodiments, the coefficient of thermal expansion of the first film may is different from the coefficient of thermal expansion of the second films.

In various embodiments, the first film includes a polyimide (PI) film and the second films may include prepreg (PPG).

In various embodiments, the at least one first wiring pattern may include a couple of first wiring patterns, wherein one of the couple of first wiring patterns has a first pattern and the other of the couple of first wiring patterns has a second pattern, and wherein the first and second patterns are disposed to be spaced apart from each other by a predetermined distance in a horizontal direction.

In various embodiments, the at least one second wiring pattern may include a couple of second wiring patterns, wherein one of the couple of second wiring patterns has a third pattern and the other of the couple of second wiring patterns has a fourth pattern, and wherein the third and fourth patterns are disposed to be spaced apart from each other by a predetermined distance in a horizontal direction.

In various embodiments, the first metal post may be disposed in a vertical pillar shape, and wherein one end of the first metal post is bonded to the first semiconductor chip and the other is bonded to the bonding finger.

In various embodiments, the first semiconductor chip and the second semiconductor chip may be bonded to face each other on both sides of the body.

In various embodiments, the first bonding finger may include a first pattern and a second pattern that are spaced apart from each other by a predetermined distance in a horizontal direction, wherein the second bonding finger includes a third pattern and a fourth pattern that are spaced apart from each other by a predetermined distance in the horizontal direction, and wherein the body further comprises a vent hole penetrating from the first surface of the body to the second surface of the body between the first pattern and the second pattern.

In various embodiments, the upper insulating pattern and the lower insulating pattern may have substantially the same thickness.

According to an embodiment, there may be provided an electronic system including a semiconductor package. The semiconductor package may include a body having a first surface and a second surface opposite to each other, and at least one first wiring pattern disposed on the first surface of the body. The semiconductor package may include an upper insulating pattern disposed on the first surface of the body to cover one portion of the at least one first wiring pattern and to expose the other portion of the at least one first wiring pattern. The exposed portion of the at least one first wiring pattern may act as a bonding finger. A lower insulating pattern may be disposed on the second surface of the body. A semiconductor chip may be disposed over the first surface of the body. A metal post may be disposed between the semiconductor chip and the bonding finger. A molding member may be disposed to cover the semiconductor chip. The body may include a first film. The upper and lower insulating patterns may include a second film.

In various embodiments, the coefficient of thermal expansion of the first film may be different from the coefficient of thermal expansion of the second films.

In various embodiments, the first film may include a polyimide (PI) film and the second films include prepreg (PPG).

According to an embodiment, there may be provided an electronic system including a semiconductor package. The semiconductor package may include a body having a first surface and a second surface opposite to each other, and at least one first wiring pattern disposed on the first surface of the body. The semiconductor package may include and an upper insulating pattern disposed on the first surface of the body to cover one portion of the at least one first wiring pattern and to expose the other portion of the at least one first wiring pattern. The exposed portion of the at least one first wiring pattern may act as a first bonding finger. At least one second wiring pattern may be disposed on the second surface of the body. A lower insulating pattern may be disposed on the second surface of the body to cover one portion of the at least one second wiring pattern and to expose the other portion of the at least one second wiring pattern. The exposed portion of the at least one second wiring pattern may act as a second bonding finger. A first semiconductor chip may be disposed on the first surface of the body. A first metal post may couple the first semiconductor chip to the first bonding finger. A second semiconductor chip may be disposed on the second surface of the body. A second metal post may electrically couple the second semiconductor chip to the second bonding finger. A molding member may be disposed to cover one of the first and second semiconductor chips. The body may include a first film. The upper and lower insulating patterns may include a second film.

In various embodiments, the coefficient of thermal expansion of the first film may be different from the coefficient of thermal expansion of the second films.

In various embodiments, the first film may include a polyimide (PI) film and the second films include prepreg (PPG).

According to an embodiment, there may be provided a memory card including a semiconductor package. The semiconductor package may include a body having a first surface and a second surface opposite to each other, and at least one first wiring pattern disposed on the first surface of the body. The semiconductor package may include an upper insulating pattern disposed on the first surface of the body to cover one portion of the at least one first wiring pattern and to expose the other portion of the at least one first wiring pattern. The exposed portion of the at least one first wiring pattern may act as a bonding finger. A lower insulating pattern may be disposed on the second surface of the body. A semiconductor chip may be disposed over the first surface of the body. A metal post may be disposed between the semiconductor chip and the bonding finger. A molding member may be disposed to cover the semiconductor chip. The body may include a first film. The upper and lower insulating patterns may include second films.

In various embodiments, the coefficient of thermal expansion of the first film may be different from the coefficient of thermal expansion of the second films.

In various embodiments, the first film may include a polyimide (PI) film and the second films include prepreg (PPG).

According to an embodiment, there may be provided a memory card including a semiconductor package. The semiconductor package may include a body having a first surface and a second surface opposite to each other, and at least one first wiring pattern disposed on the first surface of the body. The semiconductor package may include an upper insulating pattern disposed on the first surface of the body to cover one portion of the at least one first wiring pattern and to expose the other portion of the at least one first wiring pattern. The exposed portion of the at least one first wiring pattern may act as a first bonding finger. At least one second wiring pattern may be disposed on the second surface of the body. A lower insulating pattern may be disposed on the second surface of the body to cover one portion of the at least one second wiring pattern and to expose the other portion of the at least one second wiring pattern. The exposed portion of the at least one second wiring pattern may act as a second bonding finger. A first semiconductor chip may be disposed on the first surface of the body. A first metal post may couple the first semiconductor chip to the first bonding finger. A second semiconductor chip may be disposed on the second surface of the body. A second metal post may electrically couple the second semiconductor chip to the second bonding finger. A molding member may be disposed to cover one of the first and second semiconductor chips. The body may include a first film. The upper and lower insulating patterns may include second films.

In various embodiments, the coefficient of thermal expansion of the first film may be different from the coefficient of thermal expansion of the second films.

In various embodiments, the first film may include a polyimide (PI) film and the second films include prepreg (PPG).

BRIEF DESCRIPTION OF THE DRAWINGS

FIGS. 18 and 19 are a cross-sectional view and a plan view illustrating a representation of an example of a substrate according to an embodiment, respectively.

DETAILED DESCRIPTION

Figure 1:
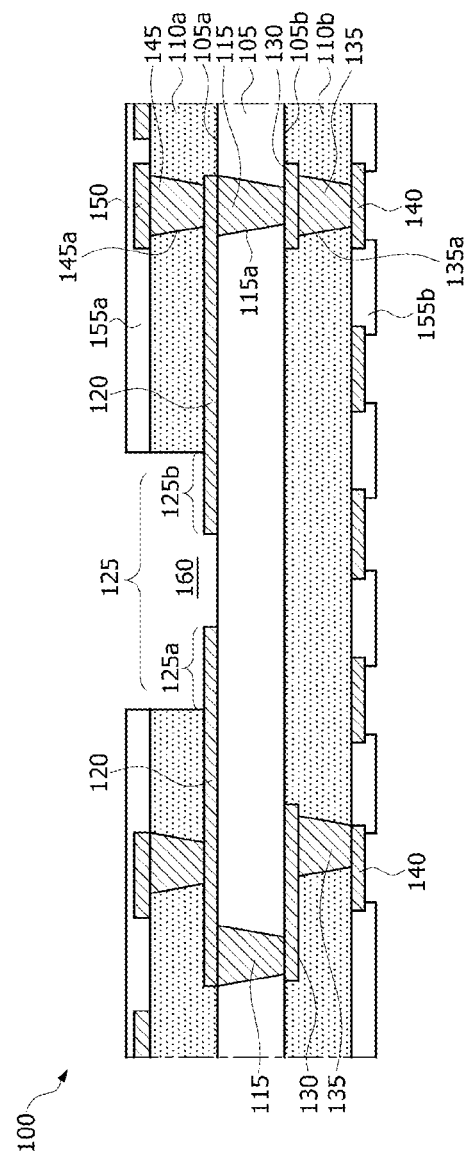
FIG. 1 is a cross-sectional view illustrating a representation of an example of a substrate according to an embodiment.

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the present disclosure to those skilled in the art.

Same reference numerals refer to same elements throughout the specification. Thus, even though a reference numeral is not mentioned or described with reference to a drawing, the reference numeral may be mentioned or described with reference to another drawing. In addition, even though the reference numerals are not illustrated, it may be mentioned or described with reference to another drawing.

Various embodiments may be directed to substrates, semiconductor packages including the same, electronic systems including the semiconductor packages, and memory cards including the semiconductor packages.

FIG. 1 is a cross-sectional view illustrating a representation of an example of a substrate 100 according to an embodiment. Referring to FIG. 1, the substrate 100 may include a body 105. The substrate 100 may include first wiring patterns 120 comprising bonding fingers 125a, 125b formed on the body 105. The substrate 100 may include an upper insulating pattern 110a disposed on one surface of the body 105, and a lower insulating pattern 110b disposed on the other surface of the body 105.

The body 105 of the substrate 100 may be a plate type member including a first surface 105a and a second surface 105b that are opposite to each other. The body 105 of the substrate 100 may be made of an insulating material which can be bent and may be composed of a thin film. In an embodiment, the body 105 may be, for example but not limited to, a polyimide film.

The first wiring patterns 120 having the bonding fingers 125a and 125b may be disposed on the first surface 105a of the body 105 of the substrate 100. The second wiring patterns 130 may be disposed on the second surface 105b of the body 105 of the substrate 100. The first and second wiring patterns 120 and 130 may be electrically connected or coupled to each other through first via electrodes 115 which penetrate the body 105 of the substrate 100. Each of the first via electrodes 115 may be a metal electrode filled in a first via hole 115a which penetrates the body 105 from the first surface 105a to the second surface 105b of the body 105. The first via hole 115a exposes a part of the surface of the second wiring pattern 130. In an embodiment, the metal electrode filling the first via hole 115a may include copper (Cu).

The upper insulating pattern 110a including second via electrodes 145 may be disposed on the first surface 105a of the body 105. In an embodiment, the upper insulating pattern 110a may be a prepreg pattern which includes a mesh type reinforced fiber containing epoxy resin or acrylate. The second via electrode 145 may be a metal electrode filling a second via hole 145a which penetrates the upper insulating pattern 110a and exposes a part of a surface of the first wiring pattern 120. The metal electrode may include copper (Cu). The upper insulating pattern 110a may include a cavity 160 exposing parts of the first wiring patterns 120. In such an example, the exposed parts of the first wiring patterns 120 may be used as the bonding fingers 125a and 125b without formation of any separate bonding fingers. The bonding fingers 125a and 125b may include a first pattern 125a and a second pattern 125b that are disposed to be spaced apart from each other by a predetermined distance in a horizontal direction.

First conductive layer patterns 150 connected or coupled to the second via electrodes 145 may be disposed on the upper insulating pattern 110a including the second via electrodes 145. The first conductive layer pattern 150 may include copper (Cu). The first conductive layer patterns 150 may be used as a power line or a ground line. A first solder mask pattern 155a may be disposed on a surface of the upper insulating pattern 110a opposite to the body 105 to cover the conductive layer patterns 150.

The lower insulating pattern 110b including third via electrodes 135 may be disposed on the second surface 105b of the body 105. In an embodiment, the lower insulating pattern 110b may be a prepreg pattern. The upper insulating pattern 110a and the lower insulating pattern 110b may be disposed to have the same thickness or substantially the same thickness. The third via electrode 135 may be a metal electrode filling a third via hole 135a that penetrates the lower insulating pattern 110b and exposes a part of the surface of the second wiring pattern 130. The metal electrode filling the third via hole 135a may include copper (Cu). Ball land pads 140 connected or coupled to the third via electrodes 135 may be disposed on a surface of the lower insulating pattern 110b opposite to the body 105. The ball land pad 140 may include copper (Cu). A second solder mask pattern 155b may be disposed on the lower insulating pattern 110b comprising the ball land pads 140. The second solder mask pattern 155b may disposed to expose the ball land pads 140.

Figure 2:
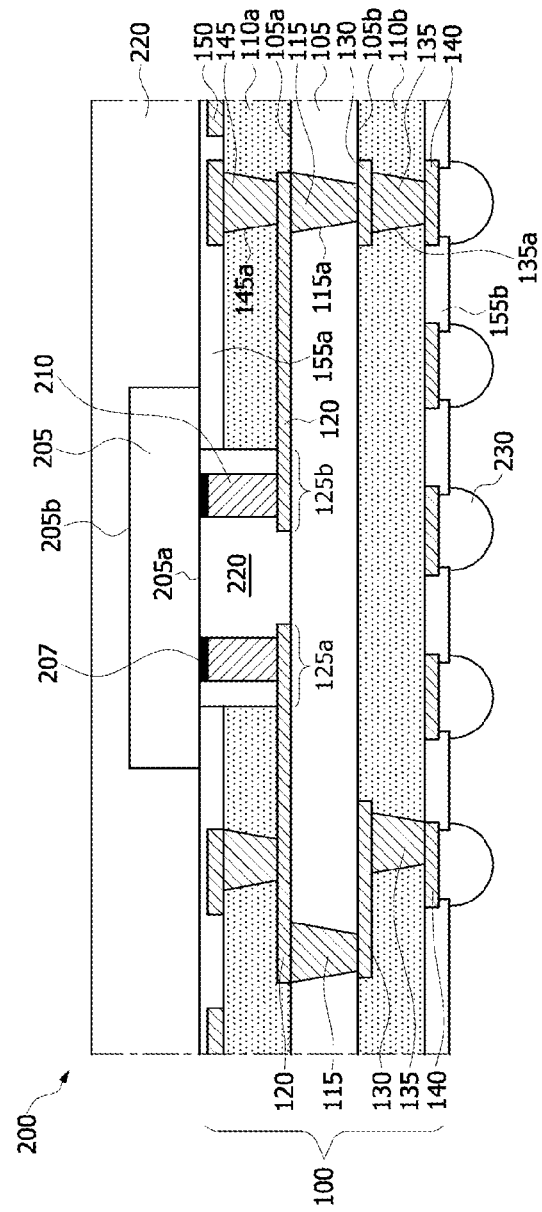
FIG. 2 is a cross-sectional view illustrating a representation of an example of a semiconductor package employing the substrate of FIG. 1.

FIG. 2 is a cross-sectional view illustrating a representation of an example of a semiconductor package 200 employing the substrate 100 of FIG. 1. The same explanation as described with reference to FIG. 1 will be omitted or briefly mentioned in this example of an embodiment.

Referring to FIG. 2, the semiconductor package 200 may include a semiconductor chip 205 attached to the substrate 100 of FIG. 1. Active devices such as transistors may be disposed in the semiconductor chip 205. In some examples, passive devices such as capacitors and resistors may also be disposed in the semiconductor chip 205. The semiconductor chip 205 may include a front side portion 205a and a back side portion 205b that are opposite to each other. In an embodiment, the front side portion 205a of the semiconductor chip 205 may include an active region, and the back side portion 205b may have an opposite surface to the front side portion 205a. Chip pads 207 may be disposed on the front side portion 205a of the semiconductor chip 205 to electrically connect or couple the semiconductor chip 205 to the substrate 100. The chip pad 207 may include a conductive material, for example, aluminum (Al) or copper (Cu).

The semiconductor chip 205 may be electrically connected or coupled to the substrate 100 through metal posts 210. Referring again to FIG. 2, the semiconductor chip 205 may be disposed on the first solder mask pattern 155a of the substrate 100. Although not illustrated in FIG. 2, the semiconductor chip 205 and the first solder mask pattern 155a may be bonded to each other using an adhesive layer. The semiconductor chip 205 may be disposed so that the chip pads 207 face the bonding fingers 125a and 125b. The metal post 210 may have a pillar shape which is perpendicular or substantially perpendicular to the first surface 105a of the body 105. One end of the metal post 210 may be bonded to the chip pad 207 of the semiconductor chip 205, and the other end of the metal post 210 may be bonded to any one of the bonding fingers 125a and 125b exposed by the cavity (see 160 of FIG. 1).

The semiconductor chip 205 and the first solder mask pattern 155a may be covered with or substantially covered with a molding member 220. The molding member 220 may include an insulating material such as an epoxy molding compound (EMC) material. The molding member 220 may be disposed to fully fill the cavity (see 160 of FIG. 1) where the metal posts 210 are disposed. External connection terminals 230 may be attached to the ball land pads 140 of the substrate 100. The external connection terminal 230 may be a solder ball.

The substrate 100 may include the body 105 and the upper and lower insulating patterns 110a and 110b disposed on both surfaces of the body 105. The body 105 may include a material having a coefficient of thermal expansion (CTE) which is different from that of the upper and lower insulating patterns 110a and 110b. In an embodiment, each of the upper and lower insulating patterns 110a and 110b may include prepreg, and the body 105 may include polyimide. If the substrate 100 is composed of a single material such as a prepreg material, the substrate should have a sufficient thickness to prevent warpage of the substrate. In this example, a total thickness of the package may increase. However, according to the present embodiment, the body 105 including polyimide may be disposed between the upper and lower insulating patterns 110 and 110b that are comprised of prepreg. Thus, even if a temperature changes, deformation of the package and/or substrate due to a difference in coefficient of thermal expansion (CTE) may be minimized because the body 105 comprising polyimide is disposed between the upper and lower insulating patterns 110a and 110b comprised of the same material to provide a symmetric structure of the substrate.

FIGS. 3 to 15 are cross-sectional views illustrating a representation of an example of a method of fabricating a semiconductor package according to an embodiment.

Figure 3:
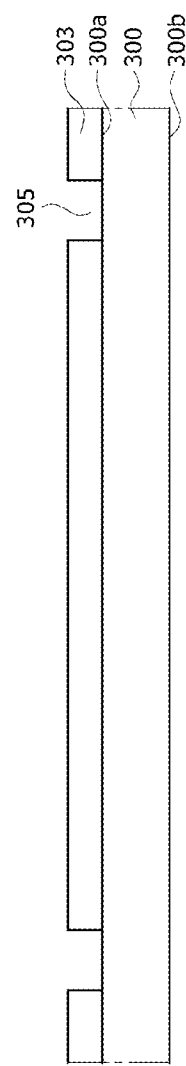
FIGS. 3 to 15 are cross-sectional views illustrating a representation of an example of a method of fabricating a semiconductor package according to an embodiment.

Referring to FIG. 3, a body 300 acting as a base member of a substrate may be provided. The body 300 may be a plate type member comprising a first surface 300a and a second surface 300b that are opposite to each other. The body 300 may be comprised of a flexible thin film, for example, a flexible insulating thin film. In an embodiment, the body 300 may include polyimide. A first mask pattern 303 comprising first openings 305 selectively exposing the surface of the body 300 may be disposed on the first surface 300a of the body 300. The first mask pattern 303 may include a photoresist material. The first opening 305 formed in the first mask pattern 303 may define positions where via holes are formed in a subsequent process.

Figure 4:
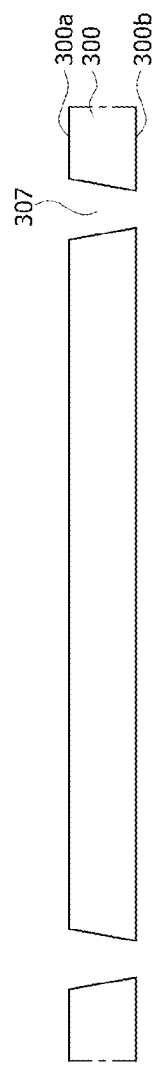

Referring to FIG. 4, first via holes 307 may be formed by removing the exposed portions of the body 300 using an etch process that employs the first mask pattern (see 303 of FIG. 3) as an etching barrier layer. The first via holes 307 may penetrate the body 300 from the first surface 300a to the second surface 300b. In an embodiment, the first via hole 307 may be formed using, for example, a laser drilling process instead of an etch process.

Figure 5:
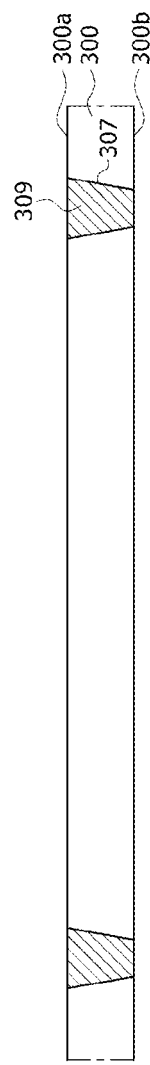

Referring to FIG. 5, first via electrodes 309 may be formed by filling the first via holes 307 with a metal electrode material. In an embodiment, the metal electrode material filling the first via holes 307 may include, for example, copper (Cu). One end of the first via electrode 309 may be formed to have a surface substantially coplanar or coplanar with the first surface 300a of the body 300. In addition, the other end of the first via electrode 309 may be formed to have a surface coplanar with or substantially coplanar with the second surface 300b of the body 300.

Figure 6:
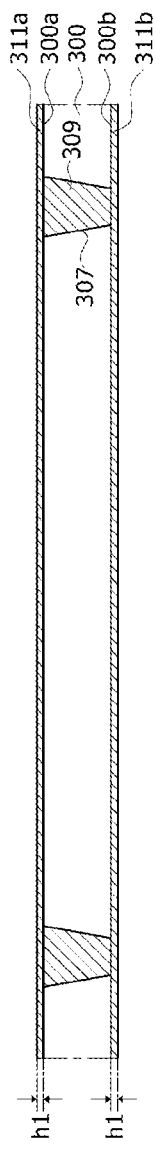

Referring to FIG. 6, a first wiring layer 311a may be formed on an entire portion of the first surface 300a of the body 300 including the first via electrodes 309, and a second wiring layer 311b may be formed on an entire portion of the second surface 300b. The first wiring layer 311a or the second wiring layer 311b may be formed using a sputtering plating process and may be formed to include, for example, copper (Cu). The first wiring layer 311a and the second wiring layer 311b may play a role of seed layers for a subsequent plating process and may be formed to have a first thickness (h1). Since the first and second wiring layers 311a and 311b are formed using a sputtering process, an adhesive strength between the body 300 and the first and second wiring layers 311a and 311b may be improved as compared with a case that the first and second wiring layers 311a and 311b are formed using a lamination technique. Thus, a possibility that the first and second wiring layers 311a and 311b are detached from the body 300 in a subsequent process may be remarkably reduced if the first and second wiring layers 311a and 311b are formed using the sputtering process.

Figure 7:
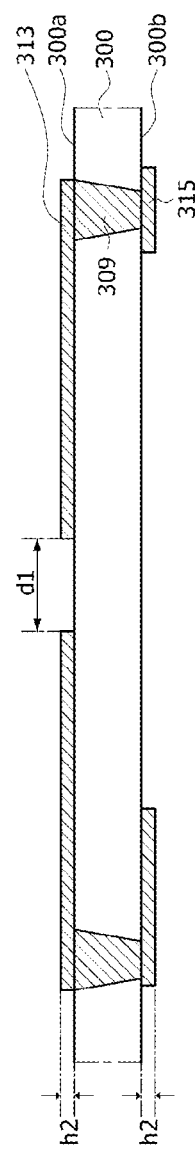
Figure 8:
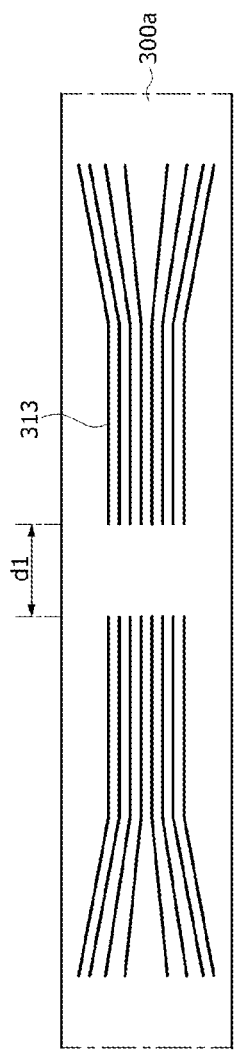

Referring to FIGS. 7 and 8, the first wiring layer 311a may be patterned to form a first wiring pattern 313, and the second wiring layer 311b may be patterned to form a second wiring pattern 315. In order to form the first and second wiring patterns 313 and 315, although not illustrated in the drawings, a photoresist pattern (not illustrated) may be formed on the first wiring layer 311a and the second wiring layer 311b that act as seed layers in a subsequent process. The photoresist pattern may be formed by coating a photoresist material having a liquid phase and applying a lithography process including an exposure step and a development step to the coated photoresist material. The photoresist pattern (not illustrated) may be formed to include openings that selectively expose portions of the first and second wiring layers 311a and 311b where the first and second wiring patterns 313 and 315 are formed in a subsequent process. The remaining portion where the first and second wiring patterns 313 and 315 are not formed may be covered with the photoresist pattern. The first and second wiring patterns 313 and 315 may be selectively formed on the exposed portions of the first and second wiring layers 311a and 311b using a plating process. The photoresist pattern may then be removed to expose portions of the first and second wiring layers 311a and 311b.

After removing the photoresist pattern, the exposed portions of the first and second wiring layers 311a and 311b may be removed to electrically isolate the first and second wiring patterns 313 and 315 from each other. Since the first and second wiring patterns 313 and 315 are formed using the plating process, the first and second wiring patterns 313 and 315 may be formed to have a second thickness (h2) greater than the first thickness (h1) of the first wiring layer 311a and the second wiring layer 311b. The first wiring patterns 313 may be formed to be fine patterns having a pitch of 20 μm or less.

Referring to FIG. 8 corresponding to a top plan view of the FIG. 7, a first group of the first wiring patterns 313 may be disposed to be spaced apart from a second group of the first wiring patterns 313 by a first distance (d1) in a horizontal direction. Generally, a body of a substrate is formed of prepreg, and a film type photoresist material is used to form wiring patterns on the body comprised of prepreg. Thus, it may be difficult to form fine patterns having a pitch of 50 μm or less. However, in the present embodiment, the first wiring pattern 313 may be formed on the body 300, which is made of a polyimide film, using a liquid type photoresist material and using sputtering and plating techniques. Thus, it may be possible to form finer patterns having a pitch of 20 μm or less. Referring again to FIG. 7, the first wiring pattern 313 contacts one end of the first via electrode 309, and the second wiring pattern 315 contacts the other end of the first via electrode 309. Accordingly, the first and second wiring patterns 313 and 315 may be electrically connected or coupled to each other through the first via electrode 309.

Figure 9:
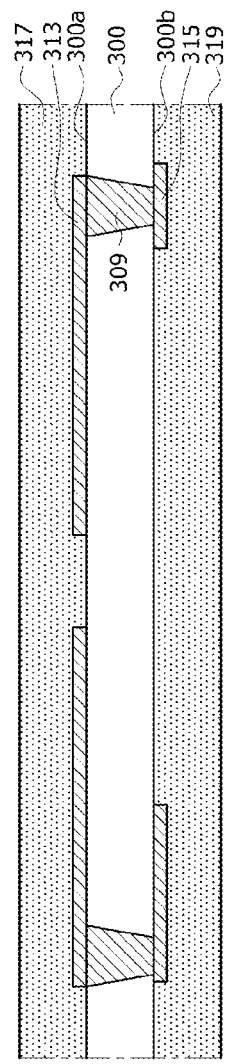

Referring to FIG. 9, an upper insulating layer 317 may be formed on the first surface 300a of the body 300 to substantially cover or cover the first wiring patterns 313, and a lower insulating layer 319 may be formed on the second surface 300b of the body 300 to substantially cover or cover the second wiring patterns 315. The upper and lower insulating layers 317 and 319 may be formed to have the same thickness or substantially the same thickness. In an embodiment, each of the upper insulating layer 317 and the lower insulating layer 319 may be formed of a prepreg material which comprises a mesh type reinforced fiber containing epoxy resin or acrylate. The prepreg material is more rigid than polyimide material. Thus, it is possible to fix the body 300 including a polyimide material that has a relatively flexible property by disposing the upper insulating layer 317 and lower insulating layer 319 on two opposite surfaces of the body 300.

Figure 10:
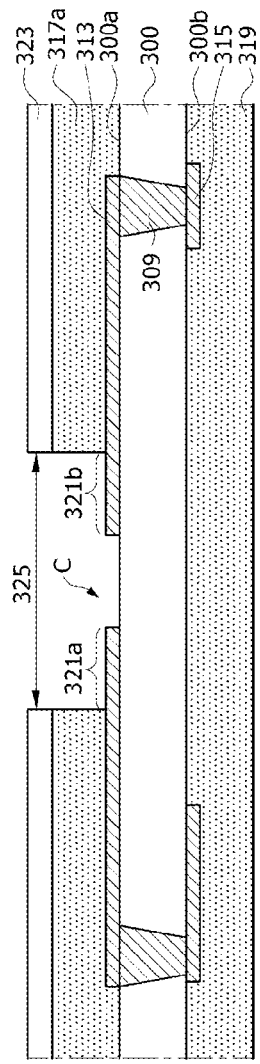

Referring to FIG. 10, a second mask pattern 323 may be formed on the upper insulating layer (see 317 of FIG. 9). The second mask pattern 323 may be formed of a photoresist material and may be formed to have a second opening 325 that exposes a portion of the upper insulating layer (see 317 of FIG. 9). The upper insulating layer 317 may be etched using the second mask pattern 323 as an etching mask, thereby forming an upper insulating pattern 317a including a cavity (C). The etching process for forming the upper insulating pattern 317a may be performed until portions of the first wiring patterns 313 are exposed. These exposed portions of the first wiring pattern 313 may function as bonding fingers 321a and 321b. The bonding fingers 321a and 321b may include a first pattern 321a and a second pattern 321b which are spaced apart from each other by a predetermined distance in a horizontal direction.

Figure 11:
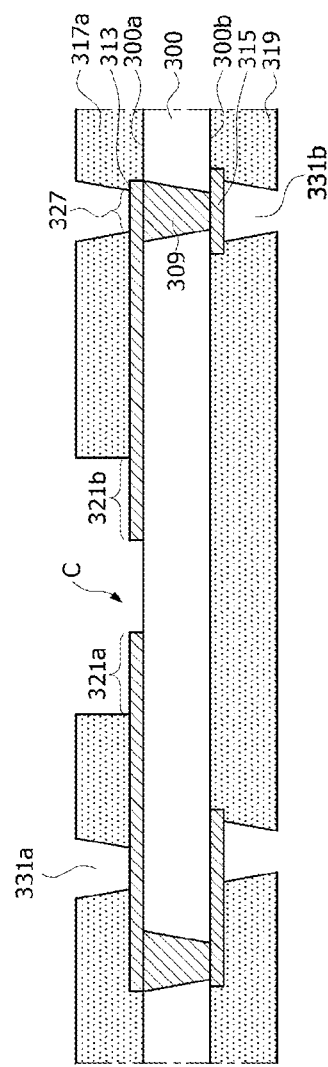

Referring to FIG. 11, the second mask pattern (see 323 of FIG. 10) may be removed after the upper insulating pattern 317a is formed. Second via holes 331a may be formed by selectively etching portions of the upper insulating pattern 317a, and third via holes 331b may be formed by selectively etching portions of the lower insulating pattern 319. In an embodiment, the second via holes 331a may be formed using a laser drilling technique or the like. The second via hole 331a may be formed to expose a portion of the first wiring pattern 313, and the third via hole 331b may be formed to expose a portion of the second wiring pattern 315.

Figure 12:
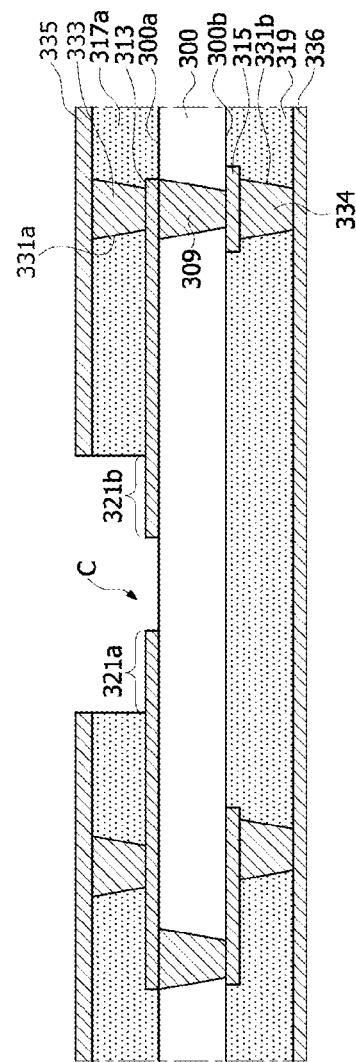

Referring to FIG. 12, second via electrodes 333 may be formed by filling the second via holes 331a in the upper insulating pattern 317a disposed on the first surface 300a of the body 300 with a metal electrode material. In an embodiment, the metal electrode material filling the second via holes 331a may include, for example, copper (Cu). One end of the second via electrode 333 may be formed to have a surface which is coplanar with an upper surface of the upper insulating pattern 317a. Also, the other end of the second via electrode 333 may contact the first wiring pattern 313. Thus, the second via electrode 333 may be electrically connected or coupled to the bonding finger 321a or 321b. Subsequently, third via electrodes 334 may be formed by filling the third via holes 331b in lower insulating layer 319 disposed on the second surface 300b of the body 300 with a metal electrode material. In an embodiment, the metal electrode material filling the third via holes 331b may include, for example, copper (Cu). One end of the third via electrode 334 may be formed to have a surface which is coplanar with or substantially coplanar with a lower surface of the lower insulating layer 319. Also, the other end of the third via electrode 334 may be connected or coupled to the second wiring pattern 315.

Next, a first conductive layer 335 may be formed on an entire portion of an upper surface of the upper insulating pattern 317a including the second via electrodes 333, and a second conductive layer 336 may be formed on an entire portion of a lower surface of the lower insulating layer 319 including the third via electrodes 334. The first conductive layer 335 and the second conductive layer 336 may be formed of, for example, a copper (Cu) material.

Figure 13:
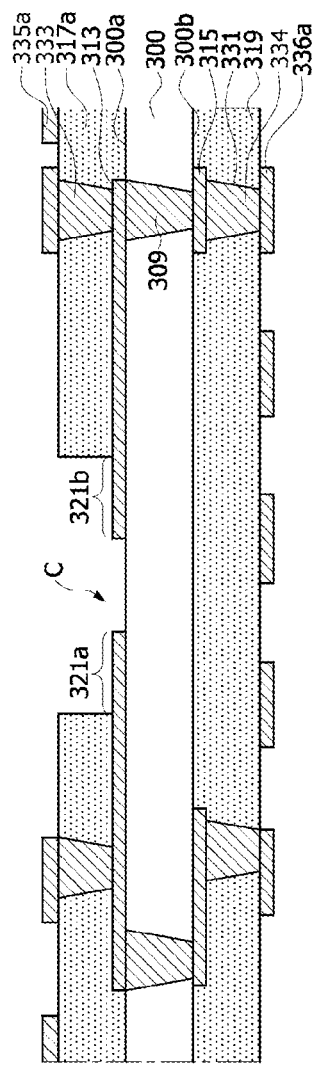

Referring to FIG. 13, the first conductive layer 335 may be patterned to form first conductive layer patterns 335a on the upper insulating layer pattern 317a, and the second conductive layer 336 may be patterned to form second conductive layer patterns 336a on the lower insulating layer 319. Some of the first conductive layer patterns 335a may be connected or coupled to the second via electrodes 333, and some of the second conductive layer patterns 336a may be connected or coupled to the third via electrodes 334.

Figure 14:
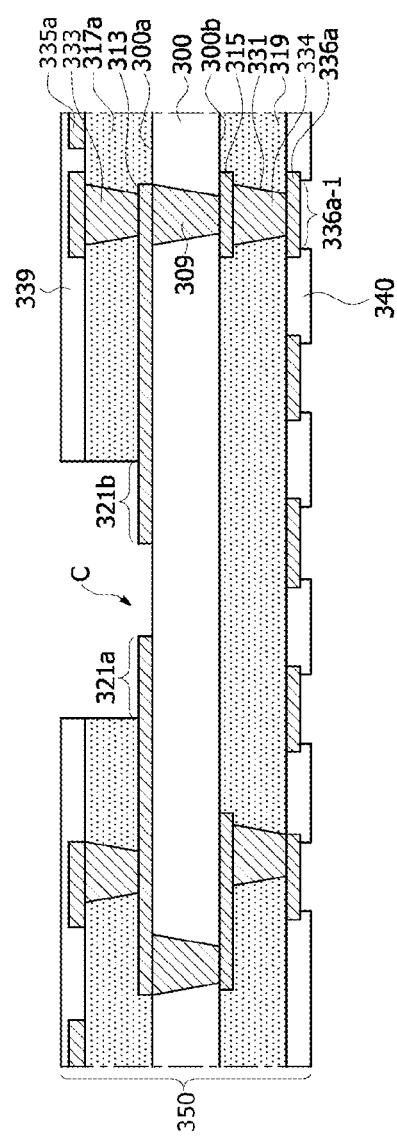

Referring to FIG. 14, a first solder mask pattern 339 may be formed on the upper insulating pattern 317a to substantially cover or cover the first conductive layer patterns 335a, and a second solder mask pattern 340 exposing the second conductive layer patterns 336a may be formed on the lower insulating pattern 319. As a result of formation of the first and second solder mask patterns 339 and 340, a substrate 350 may be completely fabricated. Some of the second conductive layer patterns 336a exposed by the second solder mask pattern 340 may function as ball land pads 336a-1 which are connected or coupled to external connection terminals in a subsequent process.

As the substrate 350 is fabricated so that the body 300 including a polyimide material is located between the upper insulating pattern 317a and the lower insulating layer 319 including a prepreg material, the warpage variation of the substrate 350 can be controlled. Specifically, even if a temperature changes, deformation of the substrate 350 due to the difference of the coefficient of thermal expansion may be minimized because the body 300 comprising polyimide is disposed between the upper and lower insulating patterns 317a and 319 comprised of the same material to provide a symmetric structure of the substrate 350. Therefore, the total warpage variation of the substrate 350 can be minimized even if the temperature of the body 300 is changed. In addition, the first and second conductive layer patterns 335a and 336a are disposed on both sides, that is, the first surface 300a and second surface 300b of the body 300. Thus the warpage variation of the substrate 350 can be suppressed. The first conductive layer pattern 335a may be used as a power or ground (PWR/GND) line.

Figure 15:
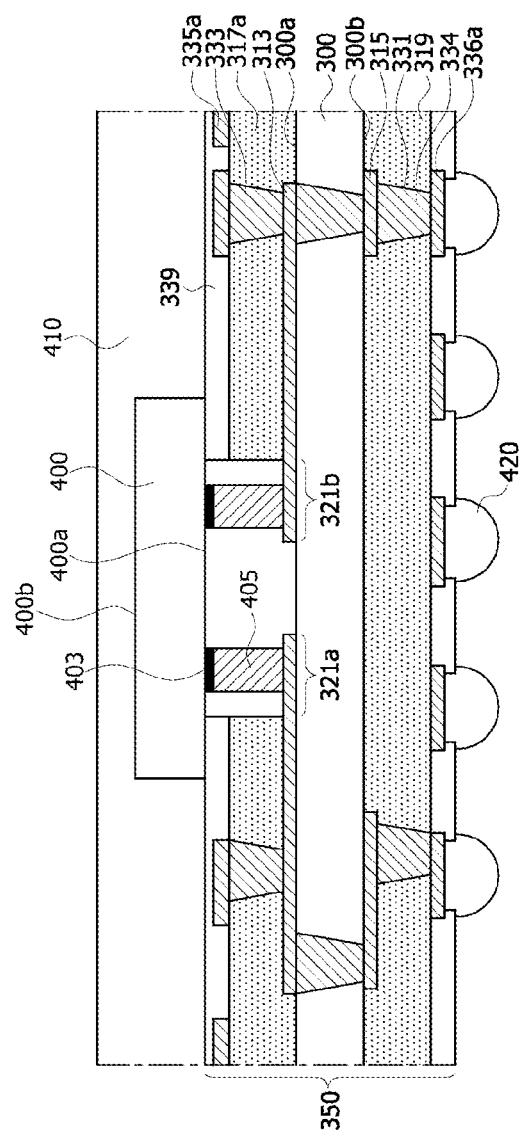

Referring to FIG. 15, a semiconductor chip 400 may be bonded to the substrate 350. Some active devices such as transistors may be disposed in the semiconductor chip 400. In some examples, some passive devices such as capacitors and/or resistors may also be disposed in the semiconductor chip 400. The semiconductor chip 400 may include a front side portion 400a and a back side portion 400b that are opposite to each other. According to an embodiment, it can be understood that the front side portion 400a of the semiconductor chip 400 is a side where the active region exists, and the back side portion 400b is a side that is opposite to the front side portion 400a. A plurality of chip pads 403 including a conductive material such as aluminum (Al) or copper (Cu) may be disposed on the front side portion 400a of the semiconductor chip 400 to electrically connect or couple the semiconductor chip 400 to the substrate 350. The semiconductor chip 400 may be disposed on the cavity (see C of FIG. 14) that exposes the bonding fingers 321a and 321b. The semiconductor chip 400 and the substrate 350 may be electrically connected or coupled to each other through metal posts 405. The metal post 405 may be formed to have a pillar shape and may be formed to include copper (Cu). One end of each metal post 405 may be bonded to one of the chip pads 403 of the semiconductor chip 400 and the other end may be bonded to one of the first bonding fingers 321a and 321b.

Next, the semiconductor chip 400 may be covered with or substantially covered with a molding member 410. The molding member 410 may include epoxy molding compound (EMC), hardener, and organic or inorganic filler. The molding member 410 may be formed to fully fill the cavity (see C of FIG. 14) that exposes the metal post 410 and the bonding fingers 321a and 321b. The molding member 410 can physically or chemically protect the semiconductor chip 400, the metal posts 405 and the bonding fingers 321a and 321b from the external environment. External connection terminals 420 may be formed on the ball land pads 336a, respectively. The external connection terminal 420 may include a solder ball.

In an embodiment, it is possible to realize a stack package structure by bonding a plurality of semiconductor chips to the bonding fingers in accordance with the position where the bonding fingers are exposed. Hereinafter, a stack package will be described in below with reference to the drawings.

Figure 16:
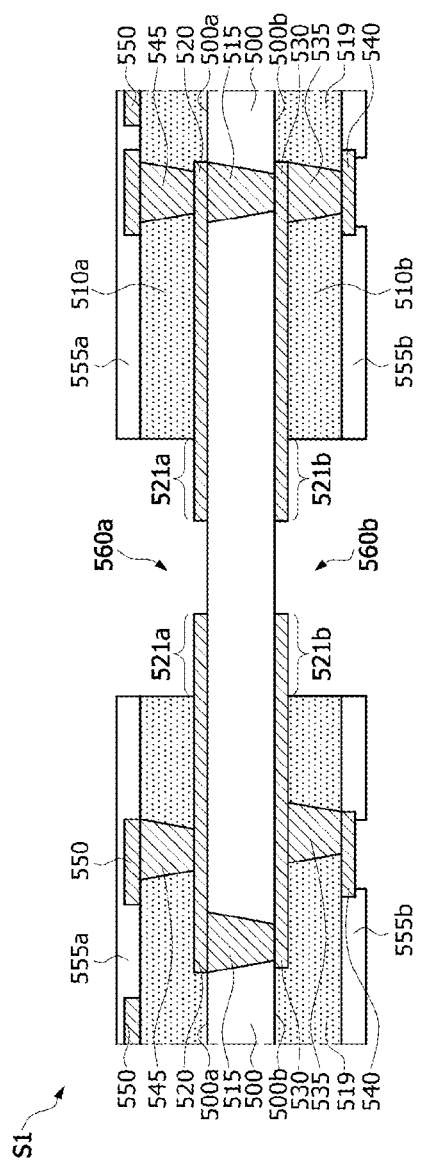
FIG. 16 is a cross-sectional view illustrating a representation of an example of a substrate according to an embodiment.
Figure 17:
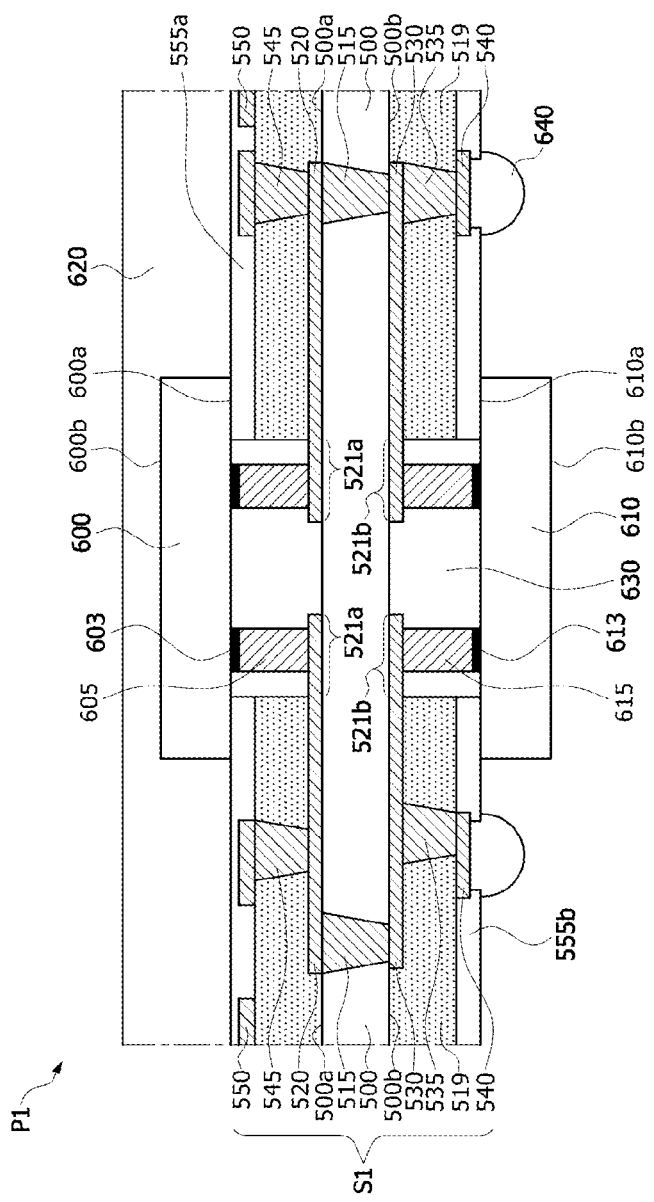
FIG. 17 is a cross-sectional view illustrating a representation of an example of a semiconductor package employing the substrate of FIG. 16.

FIG. 16 is a cross-sectional view illustrating a representation of an example of a substrate S1 according to an embodiment. FIG. 17 is a cross-sectional view illustrating a representation of an example of a semiconductor package P1 employing the substrate S1 of FIG. 16.

Referring to FIGS. 16 and 17, the substrate S1 according to an embodiment may have substantially the same configuration as the substrate 100 described with reference to FIG. 1 except that a couple of cavities are respectively disposed on both surfaces of a body. Thus, the same explanation as described with reference to FIG. 1 will be omitted or briefly mentioned in these embodiments.

The substrate S1 may include a body 500, first wiring patterns 520 comprising first bonding fingers 521a, an upper insulating pattern 510a, second wiring patterns 530 comprising second bonding fingers 521b, and a lower insulating pattern 510b. The body 500 may be provided as a plate type member comprising a first surface 500a and a second surface 500b that are opposite to each other. In an embodiment, the body 500 may include, for example but not limited to, a polyimide material.

The first wiring patterns 520 including the first bonding fingers 521a may be disposed on the first surface 500a of the body 500. The second wiring patterns 530 including the second bonding finger 521b may be disposed on the second surface 500b of the body 500. The first wiring patterns 520 may be connected or coupled to the second wiring patterns 530 through first via electrodes 515 penetrating the body 500. The first via electrodes 515 may be disposed to penetrate the body 500 from the first surface 500a to the second surface 500b. The first via electrode 515 may include, for example, copper (Cu).

The upper insulating pattern 510a including second via electrodes 545 may be disposed on the first surface 500a of the body 500. In an embodiment, the upper insulating pattern 510a may be, for example but not limited to, a prepreg pattern. The second via electrode 545 may be disposed to penetrate the upper insulating pattern 510a and to contact the first wiring pattern 520. The second via electrode 545 may include, for example, copper (Cu). The upper insulating pattern 510a may include a cavity 560a exposing portions of the first wiring patterns 520. In such an example, the exposed portions of the first wiring patterns 520 may be used as the bonding fingers 521a without formation of any separate bonding fingers. First conductive layer patterns 550 connected or coupled to the second via electrodes 545 may be disposed on the upper insulating pattern 510a including the second via electrodes 545. The first conductive layer pattern 550 may include, for example, copper (Cu). The first conductive layer patterns 550 may be used as a power or ground (PWR/GND) line. A first solder mask pattern 555a may be disposed on the upper insulating pattern 510a to cover the first conductive layer patterns 550. The upper and lower insulating patterns 510a and 510b may be disposed to have the same thickness or substantially the same thickness.

The lower insulating pattern 510b including third via electrodes 535 may be disposed on the second surface 500b of the body 500. The lower insulating pattern 510b may include the same or substantially the same material as the upper insulating pattern 510a. The third via electrode 535 may be disposed to contact the second wiring pattern 530 and to penetrate the lower insulating pattern 510b. The third via electrode 535 may include, for example, copper (Cu). The lower insulating pattern 510b may include a second cavity 560b exposing portions of the second wiring patterns 530. In such an example, the exposed portions of the second wiring patterns 530 may be used as the bonding fingers 521b without formation of any separate bonding fingers.

Ball land pads 540 may be disposed on the lower insulating pattern 510b including the third via electrodes 535. The ball land pad 540 may include, for example, copper (Cu). A second solder mask pattern 555b may be disposed on the lower insulating pattern 510b including the ball land pads 540. The second solder mask pattern 555b may expose surface of the ball land pads 540.

Referring to FIG. 17, the semiconductor package P1 may include a plurality of semiconductor chips 600 and 610 which are attached on the substrate S1 of FIG. 16. The semiconductor chips 600 and 610 may include a first semiconductor chip 600 and a second semiconductor chip 610. The first semiconductor chip 600 may be disposed above the first surface 500a of the body 500, and the second semiconductor chip 610 may disposed above the second surface 500b.

The first semiconductor chip 600 may include a front side portion 600a and a back side portion 600b, and the second semiconductor chip 610 may include a front side portion 610a and a back side portion 610b. In an embodiment, each of the front side portions 600a and 610a of the first and second semiconductor chip 600 and 610 may include active regions, and the back side portions 600b and 610b are opposite sides to the front side portions 600a and 610a. First chip pads 603 and second chip pads 613 may be disposed on the front side portions 600a and 610a of the first and second semiconductor chips 600 and 610, respectively. Each of the first chip pads 603 and the second chip pads 613 may include a conductive material, for example, aluminum (Al) or copper (Cu) to electrically connect or couple the first and second semiconductor chips 600 and 610 to the substrate S1.

The first semiconductor chip 600 may be electrically connected or coupled to the substrate S1 through first metal posts 605. The first semiconductor chip 600 may be disposed on the first solder mask pattern 555a of the substrate S1. The first semiconductor chip 600 may be disposed so that the first chip pads 603 face the first bonding fingers 521a. One end of each of the first metal posts 605 may be bonded to one of the first chip pads 603 of the first semiconductor chip 600, and the other end of each of the first metal posts 605 may be bonded to one of the first bonding fingers 521a exposed by the first cavity (see 560a in FIG. 16) to electrically connect or couple the first semiconductor chip 600 to the substrate S1.

The second semiconductor chip 610 may be electrically connected or coupled to the substrate S1 through the second metal posts 615. The second semiconductor chip 610 may be disposed on the second solder mask pattern 555b. The second semiconductor chip 610 may be disposed so that the second chip pads 613 of the second semiconductor chip 610 face the second bonding fingers 521b. One end of each of the second metal posts 615 may be bonded to one of the second chip pads 613 of the second semiconductor chip 610, and the other end of each of the second metal posts 615 may be bonded to one of the second bonding fingers 521b exposed by the second cavity (see 560b of FIG. 16) to electrically connect or couple the second semiconductor chip 610 to the substrate S1. Accordingly, the first and second semiconductor chips 600 and 610 may be bonded to face each other on both sides of the substrate S1.

The first semiconductor chip 600 and the first solder mask pattern 555a disposed on the first surface 500a of the body 500 may be covered with a first molding member 620. The first molding member 620 may fully fill an empty space of the first cavity (see 560a of FIG. 16) where the first metal posts 605 are disposed. A second molding member 630 may be disposed on the second surface 500b of the body 500. The second molding member 630 may fully fill the second cavity (see 560b in FIG. 16) where the second metal posts 615 are disposed. Each of the first molding member 620 and the second molding member 630 may include an insulating material such as epoxy molding compound (EMC). External connection terminals 640 may be attached to the ball land pads 540 disposed on the second surface 500b of the body 500.

Since the first semiconductor chip 600 and the second semiconductor chip 610 are bonded onto the first bonding fingers 521a and the second bonding fingers 521b that are disposed on the surfaces of the body 500 of the substrate S1, a total height of the semiconductor package P1 may be reduced.

Figure 18:
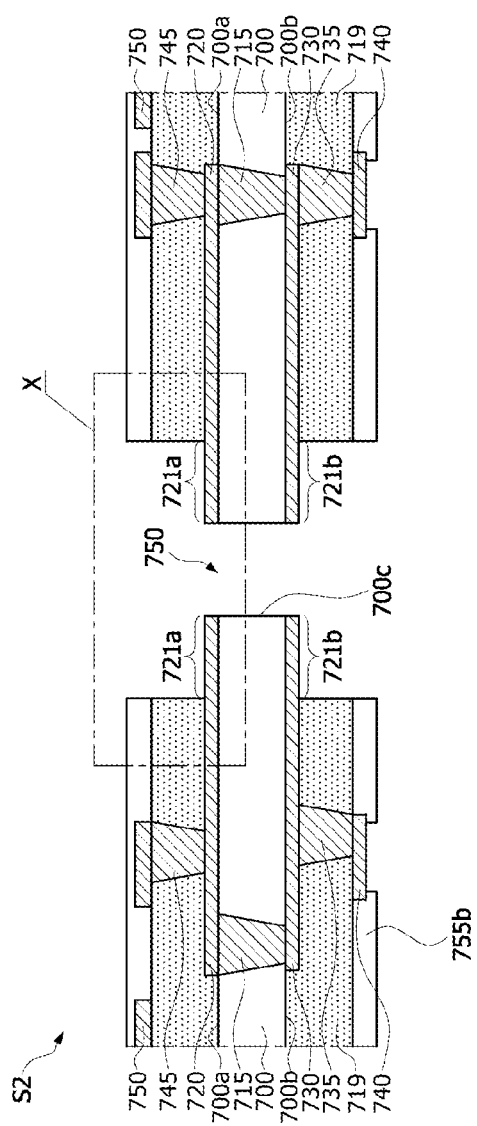
Figure 20:
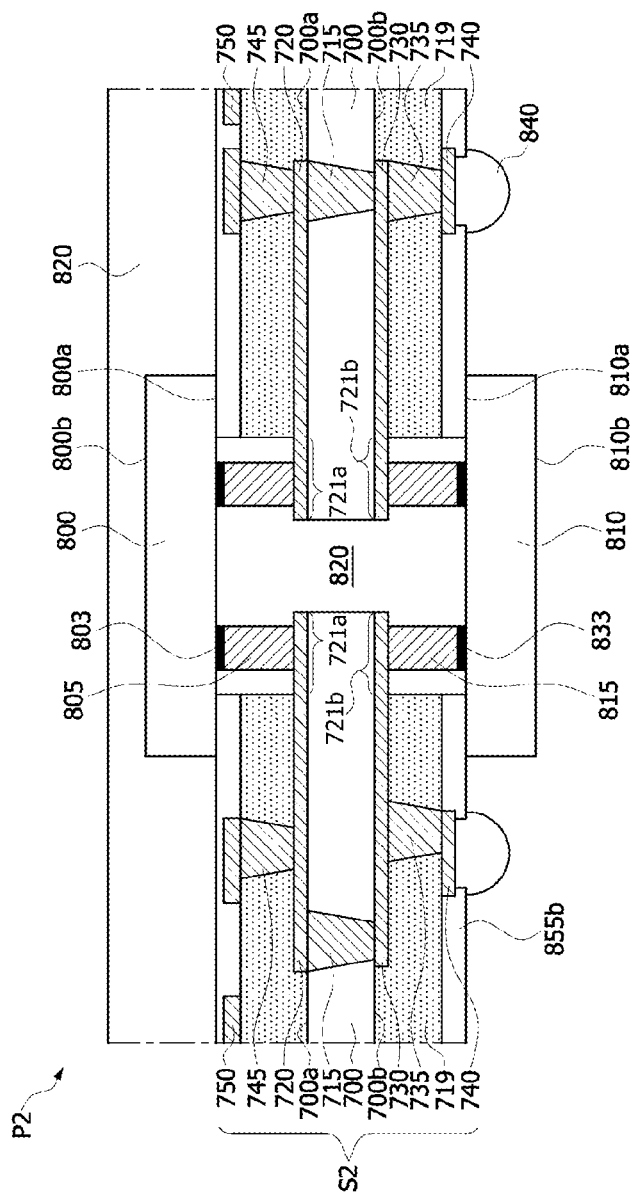
FIG. 20 is a cross-sectional view illustrating a representation of an example of a semiconductor package employing the substrate of FIG. 18.

FIG. 18 is a cross-sectional view illustrating a representation of an example of a substrate S2 according to an embodiment, and FIG. 19 illustrates a representation of an example of top plan views of a portion 'X' of FIG. 18. FIG. 20 is a cross-sectional view illustrating a representation of an example of a semiconductor package P2 employing the substrate S2 of FIG. 18.

Referring to FIG. 18, the substrate S2 according to an embodiment may include a body 700, first wiring patterns 720 comprising first bonding fingers 721a, an upper insulating pattern 710a, second wiring patterns 730 comprising second bonding fingers 721b, and a lower insulating pattern 710b. The body 700 may include a first surface 700a and a second surface 700b that are opposite to each other. The body 700 may include a polyimide material. A vent hole 750 penetrating the body 700 from the first surface 700a to the second surface 700b may be disposed in the body 700. Referring to FIG. 19 illustrating top plan views of a portion 'X' of FIG. 18, the vent hole 750 may have a rectangular shape (see a vent hole 750a of a top plan view (a) in FIG. 19) or an oval or circular shape (see a vent hole 750b of a top plan view (b) in FIG. 19), but not limited thereto. In addition, although FIGS. 18 and 19 illustrates examples in which the substrate S2 has a single vent hole 750, the present disclosure is not limited thereto. For example, the substrate S2 may have a plurality of vent holes. Inner sidewalls 700c of the body 700 may be exposed by the vent hole 750.

The first wiring patterns 720 including the first bonding fingers 721a may be disposed on the first surface 700a of the body 700, and the second wiring patterns 720b including the second bonding fingers 721b may be disposed on the second surface 700b of the body 700. The first bonding fingers 721a and the second bonding fingers 721b may be disposed to be aligned with or substantially aligned with the exposed sidewalls 700c of the body 700.

The first wiring patterns 720 may be connected or coupled to the second wiring patterns 730 through first via electrodes 715 penetrating the body 700. The upper insulating pattern 710a including second via electrodes 745 may be disposed on the first surface 700a of the body 700. The second via electrode 745 may be disposed to penetrate the upper insulating pattern 710a and to contact the first wiring pattern 720. The upper insulating pattern 710a may selectively expose portions of the first wiring patterns 720.

The portions of the first wiring patterns 720 exposed by the upper insulating pattern 710a may be used as the first bonding fingers 721a without formation of any separate bonding fingers. First conductive layer patterns 751 connected or coupled to ends of the second via electrodes 745 may be disposed on the upper insulating pattern 710a including the second via electrodes 745. The first conductive layer pattern 751 may include, for example, copper (Cu). The first conductive layer pattern 751 may be used as a power or ground (PWR/GND) line. A first solder mask pattern 755a may be disposed on a top surface of upper insulating pattern 710a to cover or substantially cover the first conductive layer patterns 751. The upper and lower insulating patterns 710a and 710b may be disposed to have the same thickness or substantially the same thickness.

The lower insulating pattern 710b including third via electrodes 735 may be disposed on the second surface 700b of the body 700. The third via electrode 735 may be disposed to penetrate the lower insulating pattern 710b and to contact the second bonding finger 721b. Each of the upper or lower insulating pattern 710a and 710b may include, for example, prepreg. The lower insulating pattern 710b may selectively expose portions of the second wiring patterns 730. Accordingly, the portions of the second wiring patterns 730 exposed by the lower insulating pattern 710b may be used as the second bonding fingers 721b without formation of any separate bonding fingers.

Ball land pads 740 may be disposed on the lower insulating pattern 710b including the third via electrodes 735. A second solder mask pattern 755b may be disposed on the lower insulating pattern 710b to expose the ball land pads 740. The second solder mask pattern 755b may be disposed to partially overlap with edges of the ball land pad 740.

Referring to FIG. 20, a semiconductor package P2 may include a plurality of semiconductor chips 800 and 810 which are bonded to the substrate S2 of FIG. 18. The semiconductor chips 800 and 810 may include a first semiconductor chip 800 and second semiconductor chip 810. The first semiconductor chip 800 may be disposed on the first surface 700a of the body 700, and the second semiconductor chip 810 may disposed on the second surface 700b of the body 700.

The first semiconductor chip 800 may include a front side portion 800a and a back side portion 800b that are opposite to each other, and the second semiconductor chip 810 may include a front side portion 810a and a back side portion 810b that are opposite to each other. In an embodiment, each of the front side portions 800a and 810a of the first semiconductor chip 800 and the second semiconductor chip 810 may include active regions. First chip pads 803 and second chip pads 833 may be disposed on the front side portions 800a and 810a of the first and second semiconductor chips 800 and 810. Each of the first chip pads 803 and second chip pads 833 may include a conductive material. The first chip pads 803 may electrically connect or couple the first semiconductor chip 800 to the substrate S2, and the second chip pads 833 may electrically connect or couple the second semiconductor chip 810 to the substrate S2.

The first semiconductor chip 800 may be electrically connected or coupled to the substrate S2 through first metal posts 805. The first semiconductor chip 800 may be disposed on the first solder mask pattern 755a. The first semiconductor chip 800 may be disposed so that the first chip pads 803 of the first semiconductor chip 800 face the first bonding fingers 721a. One end of each of the first metal posts 805 may be bonded to one of the first chip pads 803 of the first semiconductor chip 800 and the other end of each of the first metal posts 805 may be bonded to one of the first bonding fingers 721a to electrically connect or couple the first semiconductor chip 800 to the substrate S2.

The second semiconductor chip 810 may be connected or coupled to the substrate S2 through second metal posts 815. The second semiconductor chip 810 may be disposed on the second solder mask pattern 855b. The second semiconductor chip 810 may be disposed so that the second chip pads 833 of the second semiconductor chip 810 face the second bonding fingers 721b. For electrical connection or coupling between the second semiconductor chip 810 and the substrate S2, one end of each of the second metal posts 815 may be bonded to one of the second chip pads 833 of the second semiconductor chip 810, and the other end of each of the second metal posts 815 may be bonded to one of the second bonding fingers 721b. Accordingly, the first semiconductor chip 800 and the second semiconductor chip 810 may be disposed to face each other in a perpendicular direction or substantially a perpendicular direction at both sides of the substrate S2.

A molding member 820 may be disposed on the first solder mask pattern 755a and in the vent hole 750 to cover or substantially cover the first semiconductor chip 800 and the first metal posts 805. The molding member 820 may fully fill an empty space where the second metal posts 815 are disposed, through the vent hole (750 in FIG. 18). The vent hole 750 penetrating the body 700 of the substrate S2 may allow bubbles generated during the formation of the molding member 820 to be removed and may allow the molding member 820 to fill a space on the front side portion 810a. The molding member 820 may include an insulating material such as epoxy molding compound (EMC). External connection terminals 840 such as solder balls may be attached to the ball land pads 740 disposed on the second surface 700b of the body 700.

Figure 21:
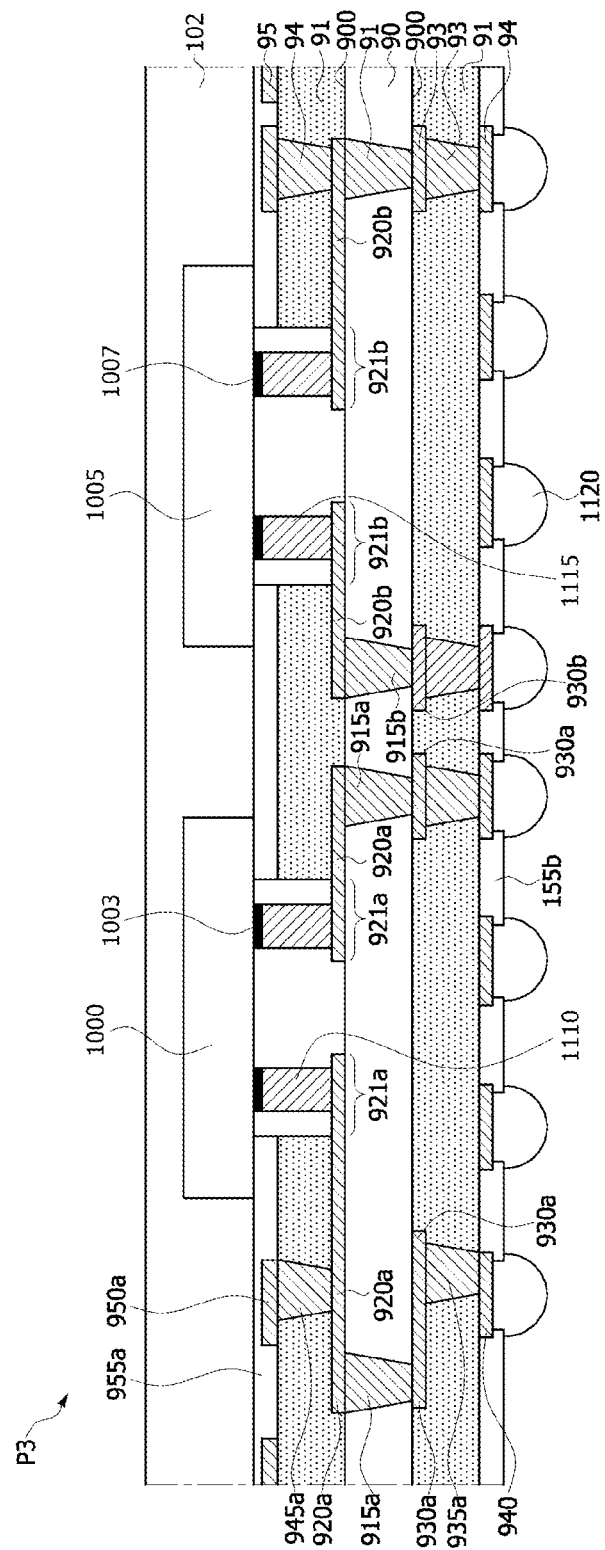
FIG. 21 is a cross-sectional view illustrating a representation of an example of a semiconductor package according to an embodiment.

FIG. 21 is a cross-sectional view illustrating a representation of an example of a semiconductor package P3 according to an embodiment.

Referring to FIG. 21, a substrate of the semiconductor package P3 may include a body 900, first wiring patterns 920a comprising first bonding fingers 921a, second wiring patterns 920b comprising second bonding fingers 921b, an upper insulating pattern 910, and a lower insulating pattern 919. The body 900 may include a first surface 900a and a second surface 900b that are opposite to each other, and may include, for example, a polyimide material.

The first wiring patterns 920a including the first bonding fingers 921a and the second wiring patterns 920b including the second bonding fingers 921b may be disposed on the first surface 900a of the body 900. The first bonding fingers 921a and the second bonding fingers 921b may be disposed on the first surface 900a of the body 900 to be spaced apart from each other in a horizontal direction. A portion of each of the first wiring patterns 920a exposed by the upper insulating pattern 910 may act as the first bonding finger 921a and a portion of each of the second wiring patterns 920b exposed by the upper insulating pattern 910 may act as the second bonding finger 921a, without formation of any separate bonding fingers. Third wiring patterns 930a and fourth wiring patterns 930b may be disposed on the second surface 900b of the body 900.

The first wiring patterns 920a may be connected or coupled to the third wiring patterns 930a through first via electrodes 915a penetrating the body 900 from the first surface 900a to the second surface 900b. One end of each of the first via electrodes 915a may be connected or coupled to one of the first wiring patterns 920a, and the other end of each of the first via electrodes 915a may be connected or coupled to one of the third wiring patterns 930a. Also, the second wiring patterns 920b may be connected or coupled to the fourth wiring patterns 930b through second via electrodes 915b. One end of each of the second via electrodes 915b may be connected or coupled to one of the second wiring patterns 920b, and the other end of each of the second via electrodes 915b may be connected or coupled to one of the fourth wiring patterns 930b.

The upper insulating pattern 910 including a first upper via electrode 945a and a second upper via electrode 945b may be disposed on the first surface 900a of the body 900. First conductive layer patterns 950a and second conductive layer patterns 950b may be disposed on the upper insulating pattern 910. One end of the first upper via electrode 945a may be connected or coupled to one of the first wiring patterns 920a, and the other end of the first upper via electrode 945a may be connected or coupled to one of the first conductive layer patterns 950a. Also, one end of the second upper via electrode 945b may be connected or coupled to one of the second wiring patterns 920b, and the other end of the second upper via electrode 945b may be connected or coupled to one of the second conductive layer patterns 950b. A first solder mask pattern 955a may be disposed on the upper insulating pattern 910 to cover the first and the second conductive layer patterns 950a and 950b. The lower insulating pattern 919 including first lower via electrodes 935a and the second lower via electrodes 935b may be disposed on the second surface 900b of the body 900. The upper insulating pattern 910 and lower insulating pattern 919 may be disposed to have the same thickness or substantially the same thickness.

Ball land pads 940 may be disposed on the lower insulating pattern 919 connected or coupled to the first lower via electrode 935a and the second lower via electrode 935b. External connection terminals 1120 may be attached to the ball land pads 940.

The semiconductor package P3 may include a plurality of semiconductor chips 1000 and 1005 disposed over the first surface 900a of the body 900. The semiconductor chips 1000 and 1005 may include a first semiconductor chip 1000 and a second semiconductor chip 1005. The first and second semiconductor chips 1000 and 1005 may be disposed to be spaced apart from each other in a horizontal direction on the first surface 900a of the body 900. First chip pads 1003 comprised of a conductive material may be disposed on a front side portion (not illustrated) of the first semiconductor chip 1000 to electrically connect or couple the first semiconductor chip 1000 to the body 900, and second chip pads 1007 comprised of a conductive material may be disposed on a front side portion (not shown) of the second semiconductor chip 1005 to electrically connect or couple the second semiconductor chip 1005 to the body 900.

The first semiconductor chip 1000 may be electrically connected or coupled to the body 900 through first metal posts 1110, and the second semiconductor chip 1005 may be electrically connected or coupled to the body 900 through second metal posts 1115. One end of each of the first metal posts 1110 may be bonded to one of the first chip pads 1003 of the first semiconductor chip 1000, and the other end of each of the first metal posts 1110 may be bonded to one of the first bonding fingers 921a. Also, one end of each of the second metal posts 1115 may be bonded to one of the second chip pads 1007 of the second semiconductor chip 1005, and the other end of each of the second metal posts 1115 may be bonded to one of the second bonding fingers 921b. A molding member 1025 may be disposed on the first solder mask pattern 955a to fully cover the first and second semiconductor chips 1000 and 1005. The molding member 1025 may fill all of empty spaces where the first and second metal posts 1110 and 1115 are disposed.

The semiconductor packages described above may be applied to various electronic systems.

Figure 22:
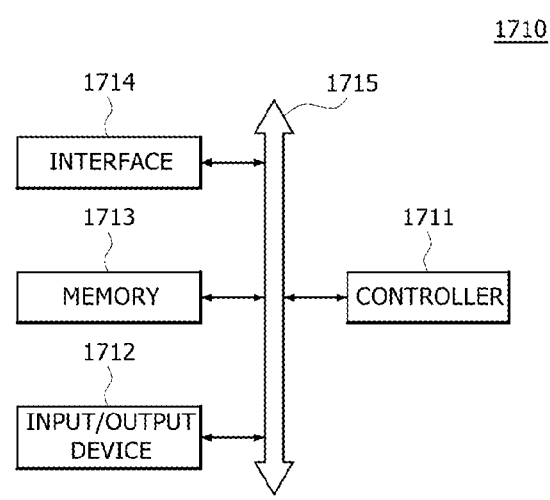
FIG. 22 is a block diagram illustrating a representation of an example of an electronic system including at least one of semiconductor packages in accordance with some embodiments.

Referring to FIG. 22, the semiconductor packages in accordance with an embodiment may be applied to an electronic system 1710. The electronic system 1710 may include a controller 1711, an input/output unit 1712, and a memory 1713. The controller 1711, the input/output unit 1712 and the memory 1713 may be coupled with one another through a bus 1715 providing a path through which data are transmitted.

For example but not limited to, the controller 1711 may include at least any one of at least one microprocessor, at least one digital signal processor, at least one microcontroller, and logic devices capable of performing the same functions as these components. At least one of the controller 1711 and the memory 1713 may include at least any one of the semiconductor packages according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic system 1710 may stably store a large amount of data in a flash memory system.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 23:
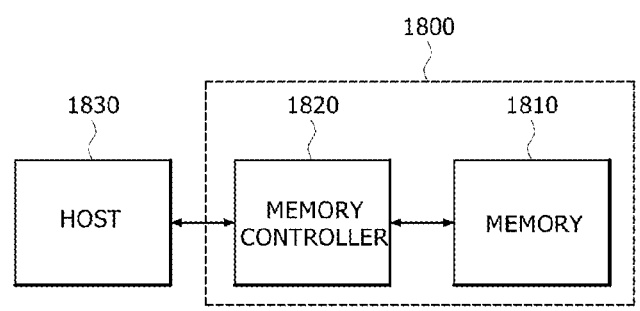
FIG. 23 is a block diagram illustrating a representation of an example of an electronic system including at least one of semiconductor packages in accordance with some embodiments.

Referring to FIG. 23, the semiconductor package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

The various embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A substrate comprising:
    a body including a first surface and a second surface opposite to each other, wherein the body includes a first film;
    at least one first wiring pattern disposed on the first surface of the body to include a bonding finger;
    a vent hole penetrated from the first surface of the body to the second surface of the body;
    an upper insulating pattern disposed on the first surface of the body to cover the overall surface of the at least one first wiring pattern except the bonding finger, wherein the upper insulating pattern includes a second film;
    a second wiring pattern disposed on the second surface of the body;
    a lower insulating pattern disposed on the second surface of the body to substantially cover the second wiring pattern, wherein the lower insulating pattern includes another second film;
    a first via electrode penetrating the body from the first surface to the second surface and coupling the at least one first wiring pattern to the second wiring pattern;
    a second via electrode penetrating the upper insulating pattern to contact the first wiring pattern;
    a first conductive layer pattern disposed on the upper insulating pattern to contact the second via electrode;
    a third via electrode penetrating the lower insulating pattern to contact the second wiring pattern; and
    a ball land pad disposed on a surface of the lower insulating pattern opposite to the body to contact the third via electrode.

2. The substrate of claim 1, wherein the coefficient of thermal expansion of the first film is different from the coefficient of thermal expansion of the second films.

3. The substrate of claim 1, wherein the first film includes a polyimide (PI) film and the second films include prepreg (PPG).

4. The substrate of claim 1, wherein the at least one first wiring pattern and the bonding finger include copper (Cu).

5. The substrate of claim 1,
    wherein the at least one first wiring pattern includes a couple of first wiring patterns;
    wherein one of the couple of first wiring patterns has a first bonding finger and the other of the couple of first wiring patterns has a second bonding finger;
    wherein the first and second bonding fingers are disposed to be spaced apart from each other by a predetermined distance in a horizontal direction; and
    wherein the vent hole is disposed between the first bonding finger and the second bonding finger.

6. The substrate of claim 1, wherein the first conductive layer pattern act as a power or ground (PWR/GND) line.

7. The substrate of claim 1, wherein the upper insulating pattern and the lower insulating pattern have substantially the same thickness.

8. A semiconductor package comprising:
    a body including a first surface and a second surface opposite to each other, wherein the body includes a first film;
    at least one first wiring pattern disposed on the first surface of the body to include a bonding finger;
    a vent hole penetrated from the first surface of the body to the second surface of the body;
    an upper insulating pattern disposed on the first surface of the body to cover the overall surface of the at least one first wiring pattern and to expose except the bonding finger, wherein the upper insulating pattern includes a second film;
a lower insulating pattern disposed on the second surface of the body, wherein the lower insulating pattern includes another second film;
a second wiring pattern disposed on the second surface of the body and covered with the lower insulating pattern;
a first via electrode penetrating the body from the first surface to the second surface and coupling the at least one first wiring pattern to the second wiring pattern;
a second via electrode disposed in the upper insulating pattern to contact the at least one first wiring pattern;
a first conductive layer pattern disposed on the upper insulating pattern to contact an end of the second via electrode;
a third via electrode disposed in the lower insulating pattern to contact the second wiring pattern;
a ball land pad disposed on a surface of the lower insulating pattern opposite to the body to contact the third via electrode;
a semiconductor chip disposed over the first surface of the body;
a metal post disposed between the semiconductor chip and the bonding finger; and
a molding member covering the semiconductor chip.

9. The semiconductor package of claim 8, wherein the coefficient of thermal expansion of the first film is different from the coefficient of thermal expansion of the second films.

10. The semiconductor package of claim 8, wherein the first film includes a polyimide (PI) film and the second films include prepreg (PPG).

11. The semiconductor package of claim 8,
wherein the at least one first wiring pattern includes a couple of first wiring patterns;
wherein one of the couple of first wiring patterns has a first bonding finger and the other of the couple of first wiring patterns has a second bonding finger;
wherein the first and second bonding fingers are disposed to be spaced apart from each other by a predetermined distance in a horizontal direction; and
wherein the vent hole is disposed between the first bonding finger and the second bonding finger.

12. The semiconductor package of claim 8, wherein the metal post is disposed in a vertical pillar shape, and
wherein one end of the metal post is bonded to the semiconductor chip, and the other is bonded to the bonding finger.

13. The semiconductor package of claim 8,
wherein the first conductive layer pattern includes a power or ground (PWR/GND) line.

14. The semiconductor package of claim 8,
wherein the upper insulating pattern and the lower insulating pattern have substantially the same thickness.

15. A semiconductor package comprising:
a body including a first surface and a second surface opposite to each other, wherein the body includes a first film;
at least one first wiring pattern disposed on the first surface of the body to include a first bonding finger;
an upper insulating pattern disposed on the first surface of the body to cover the overall surface of the at least one first wiring pattern and to expose except the first bonding finger, wherein the upper insulating pattern includes a second film;
at least one second wiring pattern disposed on the second surface of the body;
a lower insulating pattern disposed on the second surface of the body to cover one portion of the at least one second wiring pattern and to expose the other portion of the at least one second wiring pattern, wherein the exposed portion of the at least one second wiring pattern acts as a second bonding finger and the lower insulating pattern includes another second film;
a vent hole penetrated from the first surface of the body to the second surface of the body;
a first semiconductor chip disposed on the first surface of the body;
a first metal post coupling the first semiconductor chip to the first bonding finger;
a second semiconductor chip disposed on the second surface of the body;
a second metal post electrically coupling the second semiconductor chip to the second bonding finger; and
a molding member covering one of the first and second semiconductor chips through the vent hole.

16. The semiconductor package of claim 15, wherein the coefficient of thermal expansion of the first film is different from the coefficient of thermal expansion of the second films.

17. The semiconductor package of claim 15, wherein the first film includes a polyimide (PI) film and the second films include prepreg (PPG).

18. The semiconductor package of claim 15,
wherein the at least one first wiring pattern includes a couple of first wiring patterns;
wherein one of the couple of first wiring patterns has a first pattern and the other of the couple of first wiring patterns has a second pattern; and
wherein the first and second patterns are disposed to be spaced apart from each other by a predetermined distance in a horizontal direction.

19. The semiconductor package of claim 15,
wherein the at least one second wiring pattern includes a couple of second wiring patterns;
wherein one of the couple of second wiring patterns has a third pattern and the other of the couple of second wiring patterns has a fourth pattern; and
wherein the third and fourth patterns are disposed to be spaced apart from each other by a predetermined distance in a horizontal direction.

20. The semiconductor package of claim 15, wherein the first metal post is disposed in a vertical pillar shape, and
wherein one end of the first metal post is bonded to the first semiconductor chip and the other is bonded to the bonding finger.

21. The semiconductor package of claim 15, wherein the first semiconductor chip and the second semiconductor chip are bonded to face each other on both sides of the body.

22. The semiconductor package of claim 15,
wherein the first bonding finger includes a first pattern and a second pattern that are spaced apart from each other by a predetermined distance in a horizontal direction;
wherein the second bonding finger includes a third pattern and a fourth pattern that are spaced apart from each other by a predetermined distance in the horizontal direction; and
wherein the vent hole is disposed between the first pattern and the second pattern.

23. The semiconductor package of claim 15, wherein the upper insulating pattern and the lower insulating pattern have substantially the same thickness.

* * * * *